US012616020B2

(12) United States Patent
Wu

(10) Patent No.: US 12,616,020 B2
(45) Date of Patent: Apr. 28, 2026

(54) SEMICONDUCTOR DEVICE WITH THICKENING LAYER AND METHOD FOR FABRICATING THE SAME

(71) Applicant: NANYA TECHNOLOGY CORPORATION, New Taipei City (TW)

(72) Inventor: Chun-Heng Wu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 439 days.

(21) Appl. No.: 18/377,413

(22) Filed: Oct. 6, 2023

(65) Prior Publication Data

US 2025/0118664 A1     Apr. 10, 2025

(51) Int. Cl.
*H10W 20/41*          (2026.01)
*H10W 20/00*          (2026.01)
*H10W 20/44*          (2026.01)

(52) U.S. Cl.
CPC ....... *H10W 20/435* (2026.01); *H10W 20/076* (2026.01); *H10W 20/089* (2026.01); *H10W 20/4403* (2026.01)

(58) Field of Classification Search
CPC ............. H10W 20/435; H10W 20/076; H10W 20/089; H10W 20/4403
See application file for complete search history.

(56) References Cited

U.S. PATENT DOCUMENTS

2022/0093609 A1     3/2022  Huang
2022/0302274 A1*    9/2022  Kim ....................... H10D 84/83

FOREIGN PATENT DOCUMENTS

TW      202143453 A      11/2021
TW      I810062 B         7/2023
TW      202339198 A      10/2023

OTHER PUBLICATIONS

Office Action and and the search report mailed on Aug. 23, 2024 related to Taiwanese Application No. 112145818.

* cited by examiner

*Primary Examiner* — Fernando L Toledo
*Assistant Examiner* — Shawn Shaw Muslim
(74) *Attorney, Agent, or Firm* — Xuan Zhang

(57)                ABSTRACT

The present application discloses a semiconductor device and a method for fabricating the same. The semiconductor device includes a substrate; a word line structure including a word line dielectric layer in the substrate and including a U-shaped profile, a word line conductive layer on the word line dielectric layer and within the substrate, and a word line capping layer on the word line conductive layer; a top thickening layer including a U-shaped profile, between the word line conductive layer and the word line capping layer, and between the word line dielectric layer and the word line capping layer; a bottom capping layer on the substrate and adjacent to the word line dielectric layer; and a top capping layer covering the bottom capping layer and the word line structure. Top surfaces of the top thickening layer and the word line dielectric layer are coplanar and higher than the substrate.

20 Claims, 22 Drawing Sheets

SEMICONDUCTOR DEVICE WITH THICKENING LAYER AND METHOD FOR FABRICATING THE SAME

TECHNICAL FIELD

The present disclosure relates to a semiconductor device and a method for fabricating the semiconductor device, and more particularly, to a semiconductor device with a thickening layer and a method for fabricating the semiconductor device with the thickening layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a word line structure including a word line dielectric layer positioned in the substrate and including a U-shaped cross-sectional profile, a word line conductive layer positioned on the word line dielectric layer and within the substrate, and a word line capping layer positioned on the word line conductive layer; a top thickening layer including a U-shaped cross-sectional profile, positioned between the word line conductive layer and the word line capping layer, and between the word line dielectric layer and the word line capping layer; a bottom capping layer positioned on the substrate and adjacent to the word line dielectric layer; and a top capping layer covering the bottom capping layer and the word line structure. A top surface of the top thickening layer and a top surface of the word line dielectric layer are substantially coplanar and are at a vertical level higher than a top surface of the substrate.

One aspect of the present disclosure provides a semiconductor device including a substrate; a word line structure including a word line dielectric layer positioned in the substrate and including a U-shaped cross-sectional profile, a word line conductive layer including a bottom conductive portion positioned on the word line dielectric layer and within the substrate, and a top conductive portion positioned on the bottom conductive portion and within the substrate, and a word line capping layer positioned on the word line conductive layer; a bottom thickening layer including a U-shaped cross-sectional profile, positioned between the bottom conductive portion and the top conductive portion, between the top conductive portion and the word line dielectric layer, and between the word line capping layer and the word line dielectric layer; a bottom capping layer positioned on the substrate and adjacent to the word line dielectric layer; and a top capping layer covering the bottom capping layer and the word line structure. A top surface of the bottom thickening layer and a top surface of the word line dielectric layer are substantially coplanar and are at a vertical level higher than a top surface of the substrate.

Another aspect of the present disclosure provides a method for fabricating a semiconductor device including providing a substrate, forming a bottom capping layer on the substrate, and forming a word line trench through the substrate and extending to the substrate; conformally forming a word line dielectric layer on the word line trench; forming a bottom conductive portion on the word line dielectric layer and within the word line trench; conformally forming a layer of first thickening material on the bottom conductive portion, the word line dielectric layer, and the bottom capping layer; forming a top conductive portion on the layer of first thickening material and within the word line trench; conformally forming a layer of second thickening material on the top conductive portion and the layer of first thickening material; forming a layer of top insulating material on the layer of second thickening material, completely filling the word line trench; removing portions of the second thickening material, the first thickening material, and the top insulating material to respectively form a top thickening layer, a bottom thickening layer, and a word line capping layer while concurrently recessing the word line dielectric layer; and forming a top capping layer covering the bottom capping layer, the word line dielectric layer, the word line capping layer, the bottom thickening layer, and the top thickening layer.

Due to the design of the semiconductor device of the present disclosure, the gate-induced drain leakage issue is effectively mitigated by enhancing the thickness of the word line dielectric layer through the addition of the bottom thickening layer and/or the top thickening layer, thereby improving the performance of semiconductor device. Additionally, the top capping layer shields the word line dielectric layer, bottom thickening layer, and top thickening layer during etching and/or cleaning processes. This protection prevents these layers from being recessed and potentially exposing the drain region and source region, thereby averting short circuits that could occur due to such exposure.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
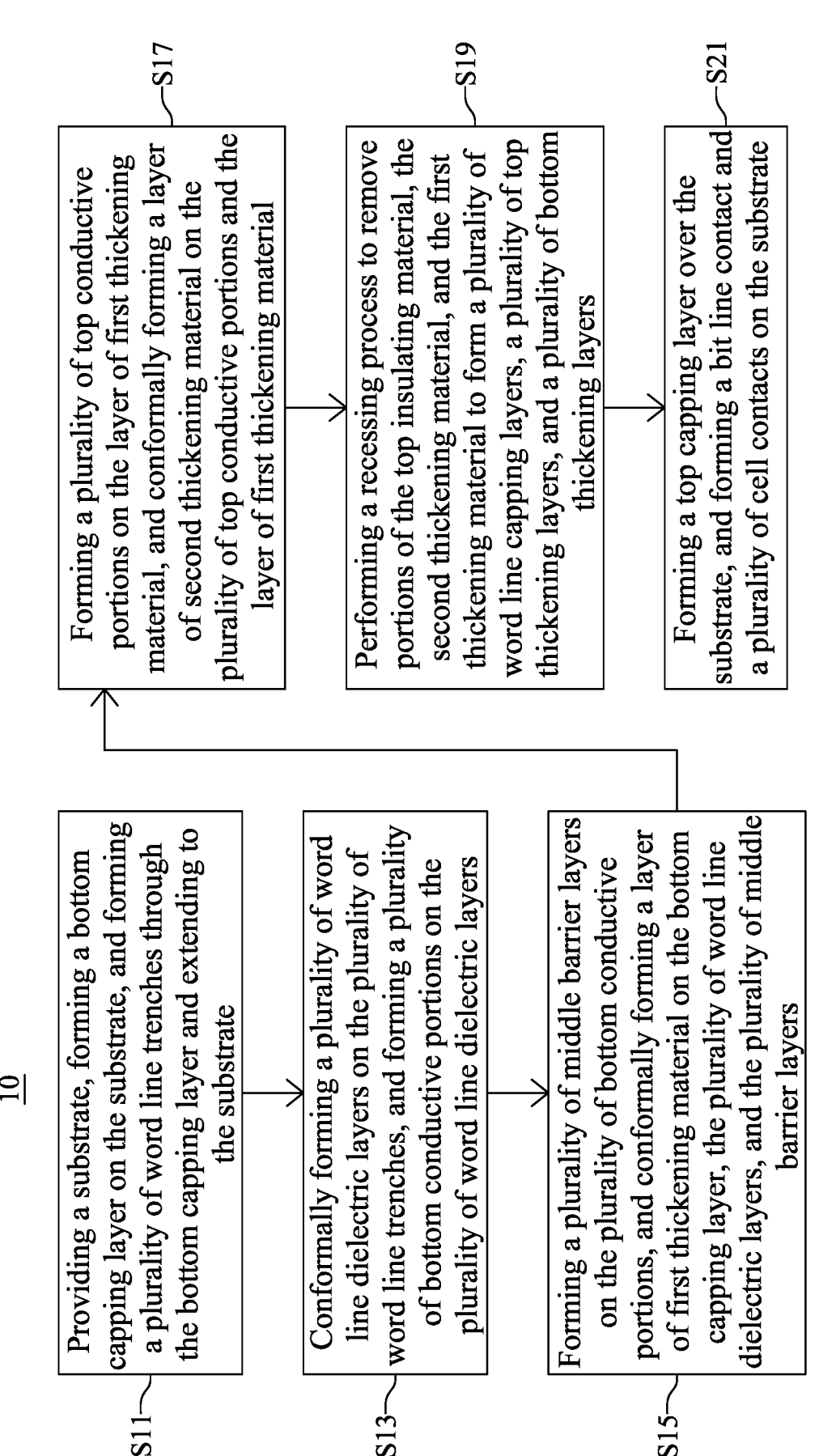
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 19 illustrate, in schematic cross-sectional view diagrams, a flow for fabricating the semiconductor device 1A in accordance with one embodiment of the present disclosure.

Figure 2:
FIGS. 2 to 19 illustrate, in schematic cross-sectional view diagrams, a flow for fabricating the semiconductor device in accordance with one embodiment of the present disclosure.
Figure 3:
Figure 3:

With reference to FIGS. 1 to 3, at step S11, a substrate 101 may be provided, a bottom capping layer 111 may be formed on the substrate 101, and a plurality of word line trenches TR may be formed through the bottom capping layer 111 and extending to the substrate 101.

With reference to FIG. 2, the substrate 101 may include a bulk semiconductor substrate. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

With reference to FIG. 2, an isolation layer 103 may be formed in the substrate 101. A series of deposition processes may be performed to deposit a pad oxide layer (not shown) and a pad nitride layer (not shown) on the substrate 101. A photolithography process and a subsequent etching process, such as an anisotropic dry etching process, may be performed to form trenches penetrating through the pad oxide layer, the pad nitride layer, and extending to the substrate 101. An insulating material may be deposited into the trenches and a planarization process, such as chemical mechanical polishing, may be subsequently performed until the top surface 101TS of the substrate 101 is exposed to remove excess filling material, provide a substantially flat surface for subsequent processing steps, and concurrently form the isolation layer 103. The insulating material may be, for example, silicon oxide or other applicable insulating materials. In some embodiments, the isolation layer 103 may define an active area AA in the substrate 101.

With reference to FIG. 2, an impurity region 105 may be formed in the active area AA. In some embodiments, the impurity region 105 may be formed by an implantation process using p-type dopants or n-type dopants. The term "p-type dopant" refers to an impurity that when added to an intrinsic semiconductor material creates deficiencies of valence electrons. In a silicon containing semiconductor material, examples of p-type dopants include, but are not limited to, boron, aluminum, gallium, or indium. The term "n-type dopant" refers to an impurity that when added to an intrinsic semiconductor material contributes free electrons to the intrinsic semiconductor material. In a silicon-containing material, examples of n-type dopants include, but are not limited to, antimony, arsenic, or phosphorus.

With reference to FIG. 2, the bottom capping layer 111 may be formed on the substrate 101 to completely cover the impurity region 105 and the isolation layer 103. In some embodiments, the bottom capping layer 111 may be formed of a material having etching selectivity to the substrate 101 and the isolation layer 103. In some embodiments, the bottom capping layer 111 may be formed of, for example, silicon nitride, boron nitride, silicon boron nitride, phosphorus boron nitride, boron carbon silicon nitride, or a combination thereof. In some embodiments, the bottom capping layer 111 may be formed of, for example, silicon nitride. In some embodiments, the bottom capping layer 111 may be formed by, for example, chemical vapor deposition, plasma-enhanced chemical vapor deposition, or other applicable deposition processes.

With reference to FIG. 2, a first mask layer 701 may be formed on the bottom capping layer 111. In some embodiments, the first mask layer 701 may be a photoresist layer and may include the pattern of the plurality of word line trenches TR.

With reference to FIG. 3, a trench etching process may be performed using the first mask layer 701 as a mask to remove portions of the bottom capping layer 111, the isolation layer 103, and portions of the substrate 101, and concurrently form the plurality of word line trenches TR. After formation of the plurality of word line trenches TR, the first mask layer 701 may be removed. The impurity region 105 may be divided into multiple segments. The segments disposed between the isolation layer 103 and the word line trench TR may be referred to as the drain regions 105D. The segments disposed between two adjacent word line trenches TR may be referred to as the source region 105S. The bottom capping layer 111 may be divided into multiple segments in a cross-sectional perspective.

With reference to FIG. 1 and FIGS. 4 to 6, at step S13, a plurality of word line dielectric layers 210 may be conformally formed on the plurality of word line trenches TR, and a plurality of bottom conductive portions 221 may be formed on the plurality of word line dielectric layers 210.

Figure 4:

With reference to FIG. 4, a layer of first insulating material 511 may be conformally formed on the bottom capping layer 111 and on the plurality of word line trenches TR. The layer of first insulating material 511 may have a U-shaped cross-sectional profile within the plurality of word line trenches TR. That is, the layer of first insulating material 511 may be conformally formed along the surface of the plurality of word line trenches TR. In some embodiments, the layer of first insulating material 511 may have a thickness in a range of about 1 nm to about 7 nm, including about 1 nm, about 2 nm, about 3 nm, about 4 nm, about 5 nm, about 6 nm, or about 7 nm.

In some embodiments, the layer of first insulating material 511 may be formed by a thermal oxidation process. For example, the layer of first insulating material 511 may be formed by oxidizing the surface of the plurality of word line trenches TR. In some embodiments, the layer of first insulating material 511 may be formed by a deposition process such as a chemical vapor deposition or an atomic layer deposition. In some embodiments, after a liner polysilicon layer (not shown for clarity) is deposited, the layer of first insulating material 511 may be formed by radical oxidizing the liner polysilicon layer. In some embodiments, after a liner silicon nitride layer (not shown for clarity) is formed, the layer of first insulating material 511 may be formed by radical oxidizing the liner silicon nitride layer. In some embodiments, the first insulating material 511 may include a material having etching selectivity to the bottom capping layer 111 and the substrate 101. In some embodiments, the first insulating material 511 may include a high-k material, an oxide, a nitride, an oxynitride or combinations thereof.

In some embodiments, the high-k dielectric material may include a hafnium-containing material. The hafnium-containing material may be, for example, hafnium oxide, hafnium silicon oxide, hafnium silicon oxynitride, or a combination thereof. In some embodiments, the high-k dielectric material may be, for example, lanthanum oxide, lanthanum aluminum oxide, zirconium oxide, zirconium silicon oxide, zirconium silicon oxynitride, aluminum oxide or a combination thereof.

Figure 5:

With reference to FIG. 5, a layer of first barrier material 521 may be conformally formed on the layer of first insulating material 511. In some embodiments, the first barrier material 521 may be, for example, titanium nitride, titanium, or a combination thereof. In some embodiments, the first barrier material 521 may be, for example, titanium nitride. In some embodiments, the layer of first barrier material 521 may be formed by, for example, atomic layer deposition, physical vapor deposition, chemical vapor deposition, or other applicable deposition processes.

With reference to FIG. 5, a layer of first conductive material 531 may be formed on the layer of first barrier material 521 and completely fill the plurality of word line trenches TR. In some embodiments, the first conductive material 531 may be, for example, tungsten, cobalt, zirconium, tantalum, aluminum, ruthenium, copper, metal carbides (e.g., tantalum carbide, titanium carbide, tantalum magnesium carbide), transition metal aluminides, or a combination thereof. In some embodiments, the first conductive material 531 may be, for example, tungsten. In some embodiments, the layer of first conductive material 531 may be formed by, for example, physical vapor deposition, sputtering, electroplating, electroless plating, chemical vapor deposition, or other applicable deposition processes.

Figure 6:

With reference to FIG. 6, a planarization process, such as chemical mechanical polishing, may be performed until the top surface 111TS of the bottom capping layer 111 is exposed to remove excess material, provide a substantially flat surface for subsequent processing steps, and turn the layer of first insulating material 511 into the plurality of word line dielectric layers 210. The plurality of word line dielectric layers 210 may be formed on the plurality of word line trenches TR, respectively and correspondingly.

With reference to FIG. 6, an etching back process may be performed to remove portions of the first barrier material 521 and the first conductive material 531. After the etching back process, the layer of first barrier material 521 is tuned into a plurality of bottom barrier layers 301 on the plurality of word line dielectric layers 210, respectively and correspondingly. The layer of first conductive material 531 is turned into the plurality of bottom conductive portions 221 on the plurality of bottom barrier layers 301, respectively and correspondingly.

For brevity, clarity, and convenience of description, only one word line dielectric layer 210, one bottom barrier layer 301, and one bottom conductive portion 221 are described.

With reference to FIG. 6, in some embodiments, the top surface 210TS of the word line dielectric layer 210 and the top surface 111TS of the bottom capping layer 111 may be substantially coplanar. In some embodiments, the top surface 221TS of the bottom conductive portion 221 and the top surface 301TS of the bottom barrier layer 301 may be substantially coplanar. In some embodiments, the top surface 221TS of the bottom conductive portion 221 and the top surface 301TS of the bottom barrier layer 301 may be at different vertical levels (not shown).

In some embodiments, the upper section of the word line dielectric layer 210 may be reduced in thickness due to consumption during etching back and/or post-etching cleaning processes. Consequently, the upper section of the word line dielectric layer 210 ends up thinner compared to the lower section of the word line dielectric layer 210. For illustration, the thickness T1 at the upper section of the word line dielectric layer 210 may be less than the thickness T2 at the lower section of the word line dielectric layer 210. In some embodiments, the thickness T1 at the upper section of the word line dielectric layer 210 may gradually increase from the top surface 210TS of the word line dielectric layer 210 downwards towards the substrate 101.

Figure 7:
Figure 7:
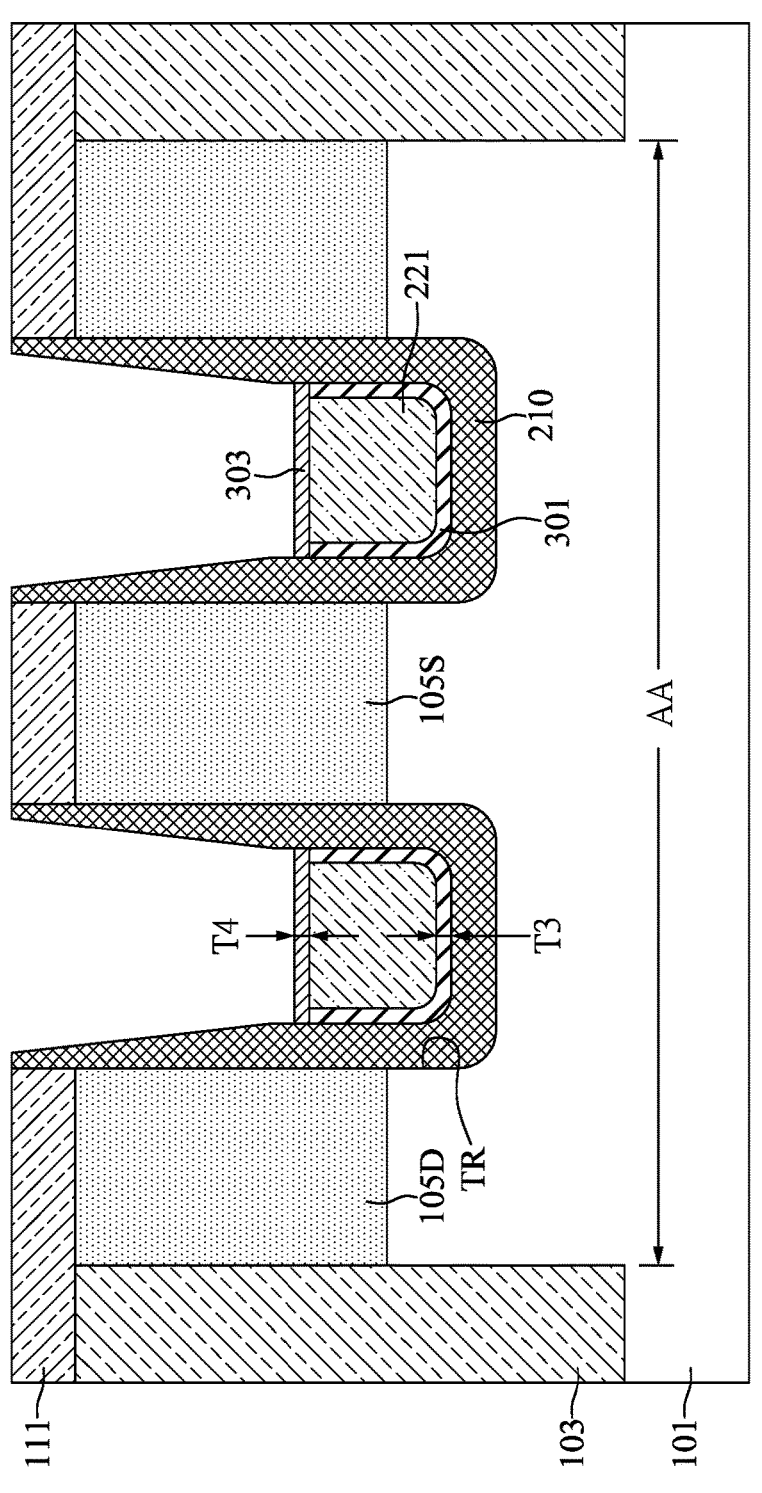
Figure 8:
Figure 8:
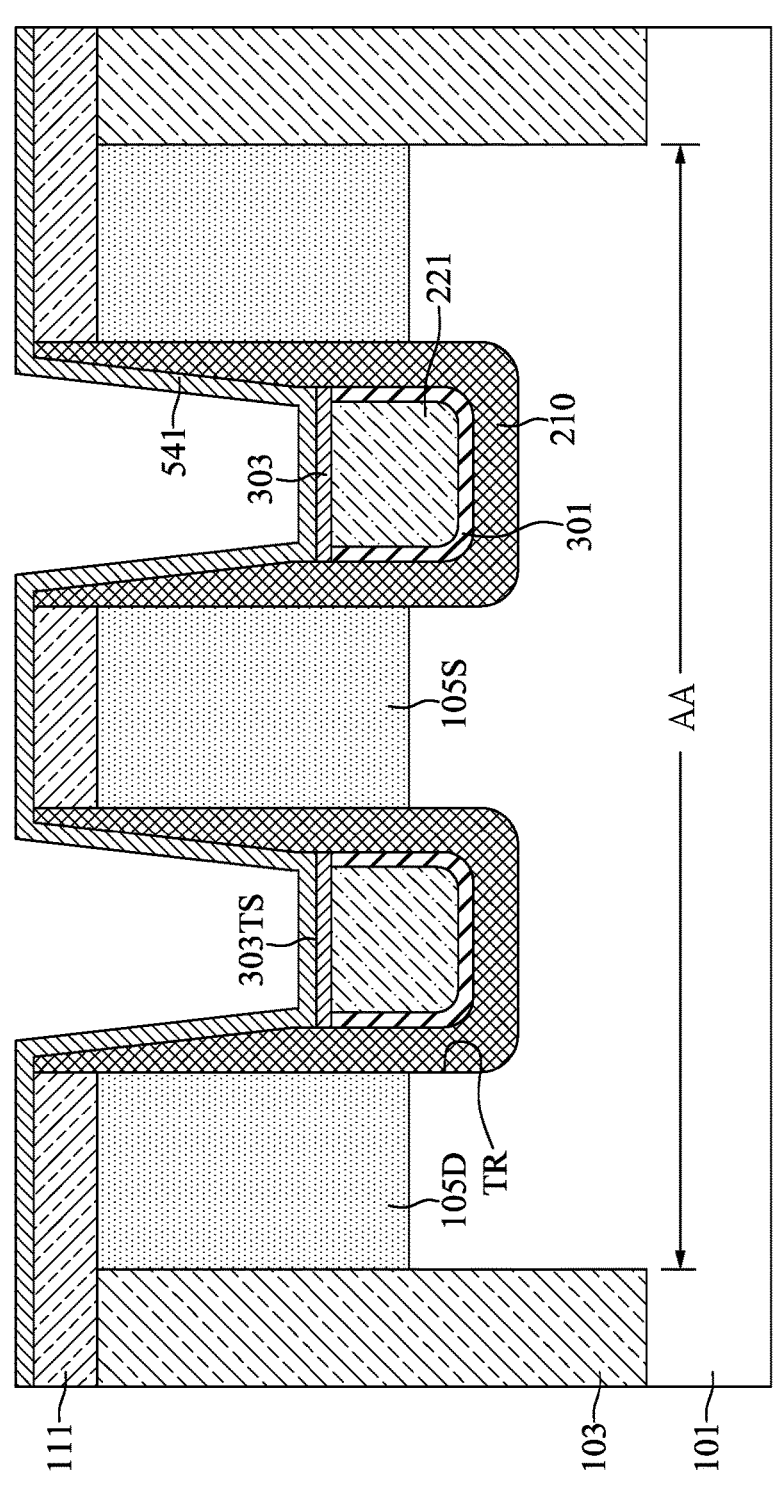

With reference to FIGS. 1, 7, and 8, at step S15, a plurality of middle barrier layers 303 may be formed on the plurality of bottom conductive portions 221, and a layer of first thickening material 541 may be conformally formed on the bottom capping layer 111, the plurality of word line dielectric layers 210, and the plurality of middle barrier layers 303.

With reference to FIG. 7, the plurality of middle barrier layers 303 may be formed on the plurality of bottom conductive portions 221, respectively and correspondingly. For brevity, clarity, and convenience of description, only one middle barrier layer 303 is described. The middle barrier layer 303 may be formed within the word line trench TR and may also cover the bottom barrier layer 301. That is, the bottom conductive portion 221 may be surrounded by the bottom barrier layer 301 and the middle barrier layer 303 in a cross-sectional perspective. In some embodiments, the middle barrier layer 303 may be formed of, for example, titanium nitride, titanium, or a combination thereof. In some embodiments, the middle barrier layer 303 may be formed of, for example, titanium nitride. In some embodiments, the middle barrier layer 303 may be formed of the same material as the bottom barrier layer 301. In some embodiments, the middle barrier layer 303 may be formed by, for example, radio-frequency physical vapor deposition or other applicable deposition. In some embodiments, the thickness T3 of the bottom barrier layer 301 and the thickness T4 of the middle barrier layer 303 may be substantially the same. In some embodiments, thickness T3 of the bottom barrier layer 301 and the thickness T4 of the middle barrier layer 303 may be different.

It should be noted that the middle barrier layer 303 may be selectively formed on the bottom conductive portion 221 and the bottom barrier layer 301. No observable middle barrier layer 303 is found on the inner surface of the word line dielectric layer 210.

With reference to FIG. 8, the layer of first thickening material 541 may be conformally formed on the bottom capping layer 111, the plurality of word line dielectric layers 210, and the plurality of middle barrier layers 303. In some embodiments, due to conforming to the inner surface of the word line dielectric layer 210 and the top surface 303TS of the middle barrier layer 303, the layer of first thickening material 541 formed within the word line trench TR may exhibit a U-shaped cross-sectional profile. In some embodiments, due to conforming to the inner surface of the word line dielectric layer 210, the layer of first thickening material 541 formed on the inner surface of the word line dielectric layer 210 may be tapered. In some embodiments, the first thickening material 541 may be, for example, a material having etching selectivity to the bottom capping layer 111. In some embodiments, the first thickening material 541 may be, for example, silicon oxide. In some embodiments, the layer of first thickening material 541 may be formed by, for example, atomic layer deposition, chemical vapor deposition, or other applicable deposition processes.

With reference to FIG. 1 and FIGS. 9 to 12, at step S17, a plurality of top conductive portions 223 may be formed on the layer of first thickening material 541, and a layer of second thickening material 543 may be conformally formed on the plurality of top conductive portions 223 and the layer of first thickening material 541.

Figure 9:

With reference to FIG. 9, a layer of second conductive material 533 may be formed on the layer of first thickening material 541 and completely fill the word line trench TR. In some embodiments, the second conductive material 533 may be, for example, polycrystalline silicon, polycrystalline germanium, polycrystalline silicon germanium, doped polycrystalline silicon, doped polycrystalline germanium, doped polycrystalline silicon germanium, or a combination thereof. In some embodiments, the layer of second conductive material 533 may be doped with p-type dopants or n-type dopants. In some embodiments, the layer of second conductive material 533 may be formed by, for example, chemical vapor deposition or other applicable deposition processes. In some embodiments, the doping may be achieved by an implantation process after the deposition process. In some embodiments, the doping may be performed by incorporating the dopants during the deposition process.

Figure 10:

With reference to FIG. 10, an etching back process may be subsequently performed to remove portions of the second conductive material 533 to form the plurality of top conductive portions 223. For brevity, clarity, and convenience of description, only one top conductive portion 223 is described. The top conductive portion 223 may be formed on the layer of first thickening material 541 and within the word line trench TR. The bottom conductive portion 221 and the top conductive portion 223 together configure the word line conductive layer 220.

In some embodiments, the upper section of layer of first thickening material 541, which is formed on the word line dielectric layer 210, may be consumed during the etching back process or a post-cleaning process after the etching back process. That is, the thickness for the upper section may be reduced or the upper section may be completely consumed so that the upper section of the word line dielectric layer 210 may be partially exposed (not shown).

Figure 11:
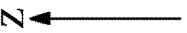

With reference to FIG. 11, the layer of second thickening material 543 may be conformally formed on the layer of first thickening material 541 and the plurality of top conductive portions 223. In some embodiments, due to conforming to the layer of first thickening material 541, the layer of second thickening material 543 formed within the word line trench TR may exhibit a U-shaped cross-sectional profile. In some embodiments, the layer of second thickening material 543 formed within the word line trench TR may be tapered. In some embodiments, the second thickening material 543 may be, for example, a material having etching selectivity to the bottom capping layer 111. In some embodiments, the second thickening material 543 may be the same material as the first thickening material 541. In some embodiments, the second thickening material 543 may be, for example, silicon oxide. In some embodiments, the layer of second thickening material 543 may be formed by, for example, atomic layer deposition, chemical vapor deposition, or other applicable deposition processes.

Figure 12:

With reference to FIG. 12, a layer of top insulating material 513 may be formed on the layer of second thickening material 543 and completely fill the plurality of word line trenches TR. In some embodiments, the top insulating material 513 may be, for example, a material having etching selectivity to the word line dielectric layer 210, the first thickening material 541, and the second thickening material 543. In some embodiments, the top insulating material 513 may be, for example, silicon nitride, boron nitride, silicon boron nitride, phosphorus boron nitride, boron carbon silicon nitride, or a combination thereof. In some embodiments, the top insulating material 513 may be, for example, silicon nitride. In some embodiments, the layer of top insulating material 513 may be formed by, for example, chemical vapor deposition, plasma-enhanced chemical vapor deposition, or other applicable deposition processes.

With reference to FIG. 1 and FIGS. 13 to 15, at step S19, a recessing process may be performed to remove portions of the top insulating material 513, the second thickening material 543, and the first thickening material 541 to form a plurality of word line capping layers 230, a plurality of top thickening layers 403, and a plurality of bottom thickening layers 401.

In some embodiments, the recessing process may be a multi-stage etching process. For example, the recessing process may be a three-stage etching process. The etching chemistry may be different for each stage to provide different etching selectivity. In some embodiments, the recessing process may alternate between using phosphoric acid and diluted hydrofluoric acid, selectively removing nitride and oxide, respectively. In some embodiments, the recessing process may include vapor hydrofluoric acid and ammonia. By adjusting the ratio between vapor hydrofluoric acid and ammonia used in the recessing process, either nitride or oxide can be selectively etched.

Figure 13:
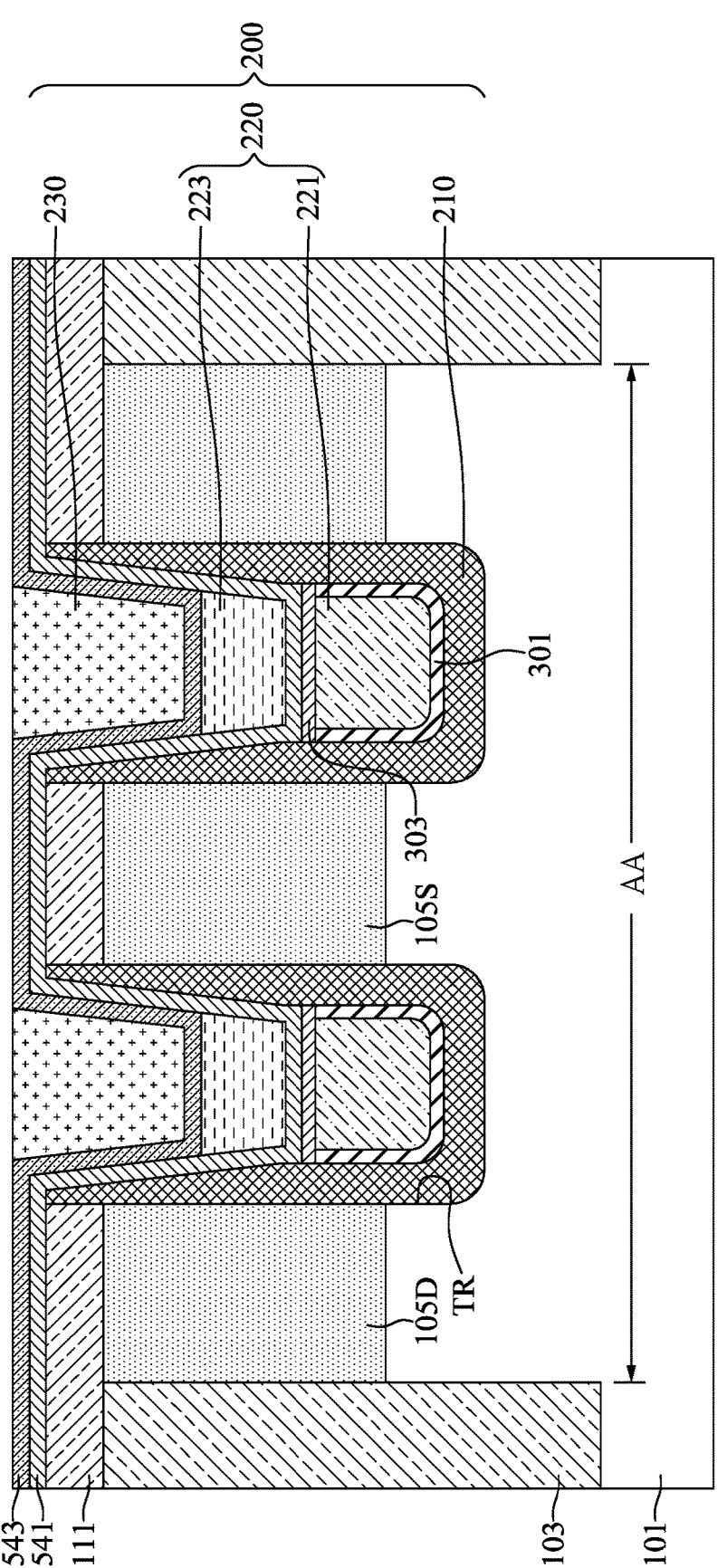

With reference to FIG. 13, during the first stage of the recessing process, the top insulating material 513 may be selectively removed. The end point may be identified by detecting the layer of second thickening material 543 and/or the first thickening material 541. In some embodiments, the first stage of the recessing process may include phosphoric acid to selectively remove the top insulating material 513, which includes silicon nitride. After the first stage of the recessing process, the remaining top insulating material 513 may be referred to as the plurality of word line capping layers 230. The word line dielectric layer 210, the word line conductive layer 220, the word line capping layer 230 together configure the word line structure 200.

Figure 14:
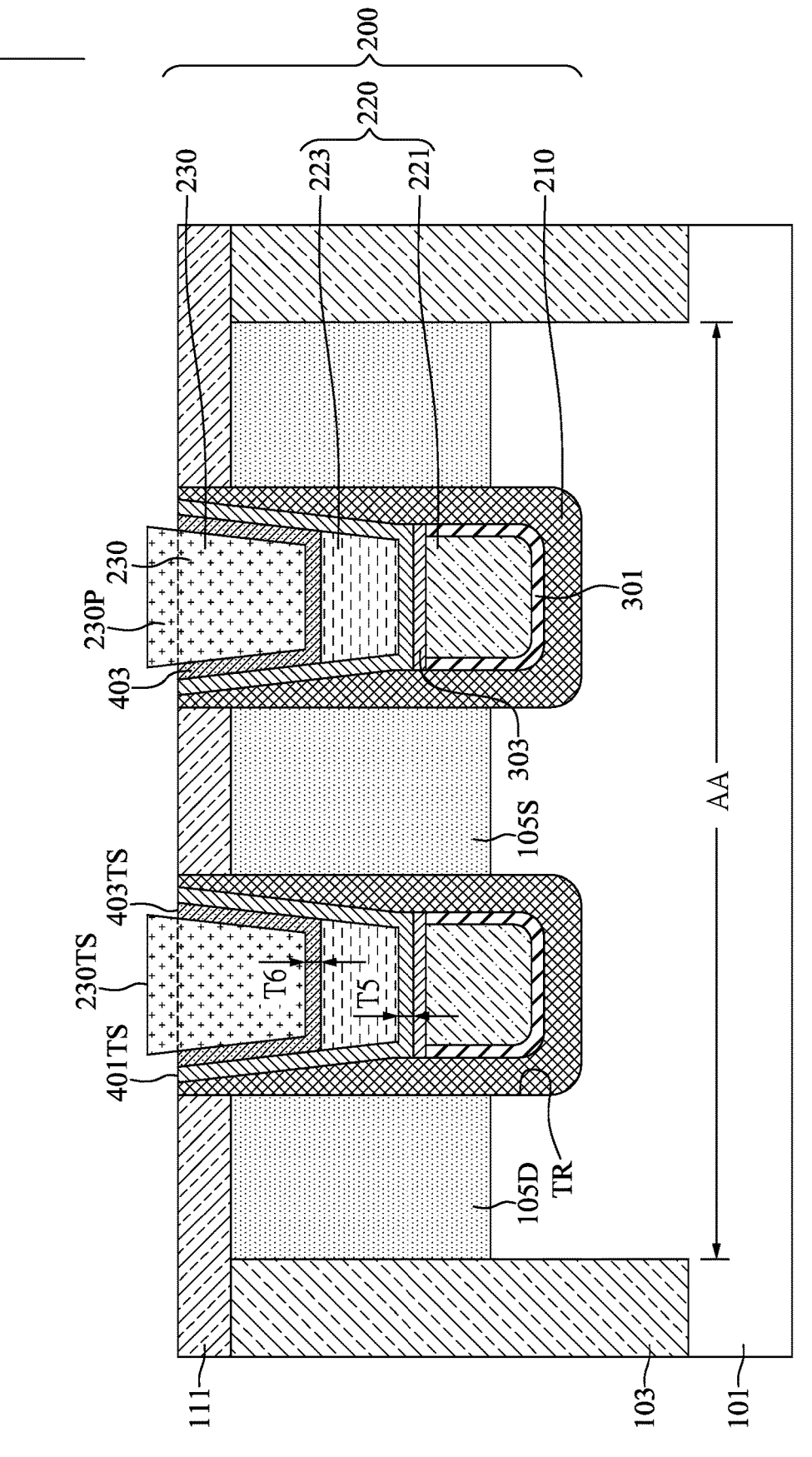

With reference to FIG. 14, during the second stage of the recessing process, the first thickening material 541 and the second thickening material 543 formed on the bottom capping layer 111 may be selectively removed. The end point may be identified by detecting the bottom capping layer 111. In some embodiments, the second stage of the recessing process may include diluted hydrofluoric acid to selectively remove the first thickening material 541 and the second thickening material 543, which include silicon oxide. After the second stage of the recessing process, the remaining second thickening material 543 may be turned into the top thickening layers 403. The remaining first thickening material 541 may be turned into the bottom thickening layers 401. In some embodiments, the thickness T5 of the bottom thickening layer 401 and the thickness T6 of the top thickening layer 403 may be substantially the same. In some embodiments, the thickness T5 of the bottom thickening layer 401 and the thickness T6 of the top thickening layer 403 may be different.

In the current stage, the top surface 230TS of the word line capping layer 230 may be at a vertical level higher than the top surface 401TS of the bottom thickening layer 401 or the top surface 403TS of the top thickening layer 403. The section of the word line capping layer 230 located above the bottom thickening layer 401 or the top thickening layer 403 may be referred to as the protruding section 230P of the word line capping layer 230.

Figure 15:
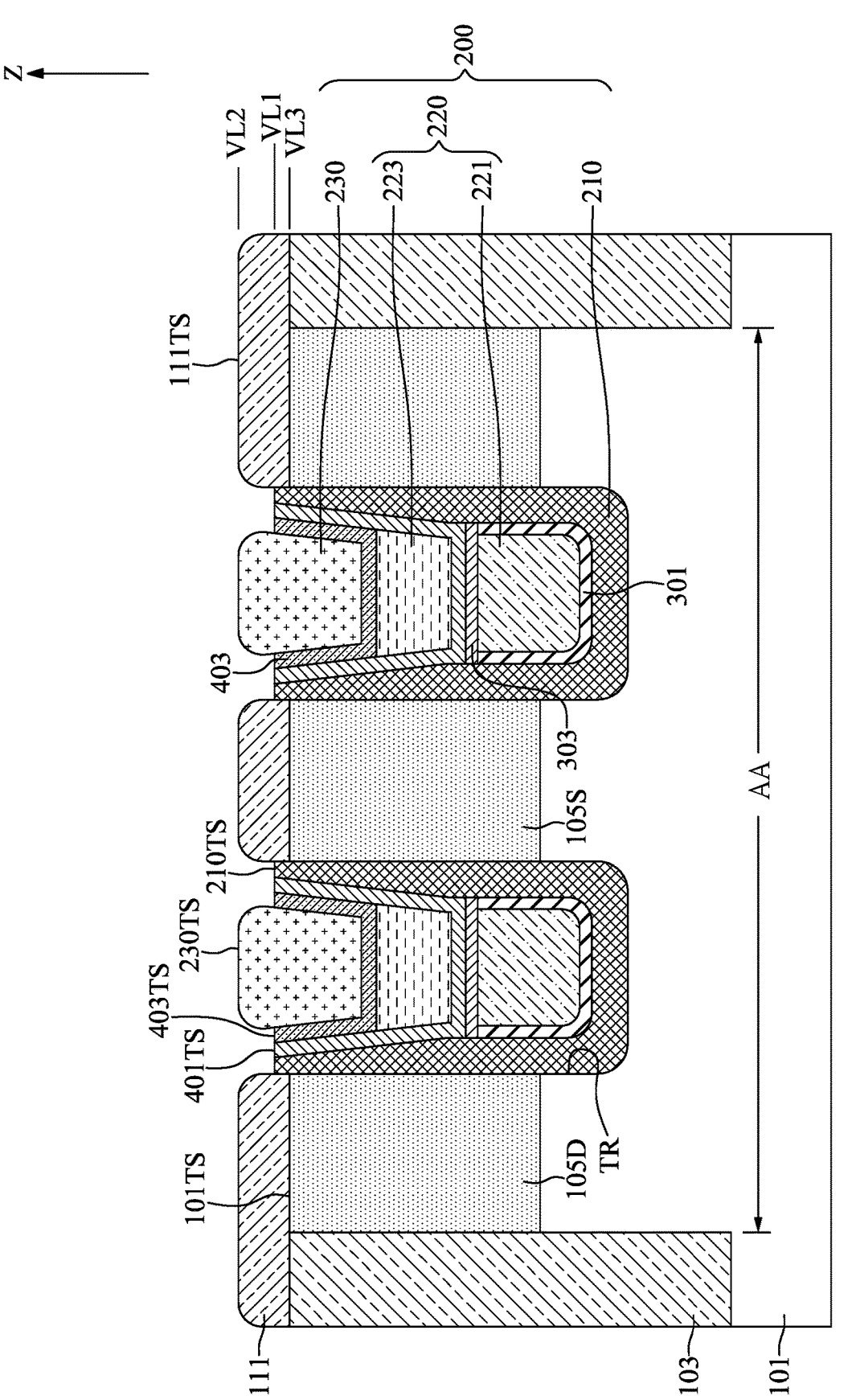

With reference to FIG. 15, during the third stage of the recessing process, the protruding section 230P of the word line capping layer 230 may be selectively removed. The stage may be performed for a predetermined time interval. In some embodiments, the third stage of the recessing process may include phosphoric acid to selectively remove the protruding section 230P of the word line capping layer 230. In some embodiments, during the third stage of the recessing process, the word line dielectric layer 210, the bottom thickening layer 401, and the top thickening layer 403 may be slightly consumed so that the top surfaces 210TS, 401TS, 403TS of the word line dielectric layer 210, the bottom thickening layer 401, and the top thickening layer 403 may be also recessed. In some embodiments, the word line dielectric layer 210, the bottom thickening layer 401, and the top thickening layer 403 may be slightly consumed during the cleaning process after the third stage of the recessing process.

In some embodiments, the top surfaces 210TS, 401TS, 403TS of the word line dielectric layer 210, the bottom thickening layer 401, and the top thickening layer 403 may be substantially coplanar. In some embodiments, the top surface 111TS of the bottom capping layer 111 and the top surface 230TS of the word line capping layer 230 may be substantially coplanar. In some embodiments, the top surfaces 210TS, 401TS, 403TS of the word line dielectric layer 210, the bottom thickening layer 401, and the top thickening layer 403 may be at the vertical level VL1 lower than the vertical level VL2 of the top surface 230TS of the word line capping layer 230. In some embodiments, the top surfaces 210TS, 401TS, 403TS of the word line dielectric layer 210, the bottom thickening layer 401, and the top thickening layer 403 may be at the vertical level VL1 higher than the vertical level VL3 of the top surface 101TS of the substrate 101.

In some embodiments, the top surface 111TS of the bottom capping layer 111 and the top surface 230TS of the word line capping layer 230 may be at different vertical levels (not shown). However, both the top surface 111TS of the bottom capping layer 111 and the top surface 230TS of the word line capping layer 230 may be at the vertical levels higher than the top surfaces 210TS, 401TS, 403TS of the word line dielectric layer 210, the bottom thickening layer 401, and the top thickening layer 403.

In some embodiments, the top surfaces 210TS, 401TS, 403TS of the word line dielectric layer 210, the bottom thickening layer 401, and the top thickening layer 403 may be at different vertical levels (not shown). However, the top surfaces 210TS, 401TS, 403TS of the word line dielectric layer 210, the bottom thickening layer 401, and the top thickening layer 403 may be at the vertical levels higher than the top surface 101TS of the substrate 101.

In some embodiments, the top surface 230TS of the word line capping layer 230 may be curved. State differently, the word line capping layer 230 may have a round top surface 230TS. Detailedly, the top surface 230TS of the word line capping layer 230 may include a flat section that is parallel to the top surface 101TS of the substrate 101, with both ends of this flat section smoothly transitioning into curves.

In some embodiments, the top surface 111TS of the bottom capping layer 111 may be curved. State differently, the bottom capping layer 111 may have a round top surface 111TS. Detailedly, the top surface 111TS of the bottom capping layer 111 may include a flat section parallel to the top surface 101TS of the substrate 101, with its ends smoothly transitioning into a curved form.

Conventionally, the upper section of the word line dielectric layer 210 may be reduced in thickness during processes like etching back or cleaning, potentially leading to gate-induced drain leakage. In contrast, the implementation of the bottom thickening layer 401 and the top thickening layer 403 may enhance the insulating capability of the word line dielectric layer 210 by increasing its thickness. This approach effectively mitigates the issue of gate-induced drain leakage, consequently improving the performance of the semiconductor device 1A.

With reference to FIG. 1 and FIGS. 16 to 19, at step S21, a top capping layer 113 may be formed over the substrate 101, and a bit line contact 601 and a plurality of cell contacts 603 may be formed on the substrate 101.

Figure 16:
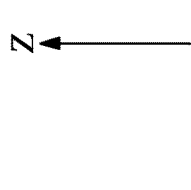

With reference to FIG. 16, the top capping layer 113 may be formed over the substrate 101 to cover the bottom capping layer 111, the word line dielectric layer 210, the bottom thickening layer 401, the top thickening layer 403, and the word line capping layer 230. In some embodiments, the top capping layer 113 may be formed of, for example, a material having etching selectivity to the word line dielectric layer 210, the bottom thickening layer 401, and the top thickening layer 403. In some embodiments, the top capping layer 113 may be formed of, for example, silicon nitride, boron nitride, silicon boron nitride, phosphorus boron nitride, boron carbon silicon nitride, or a combination thereof. In some embodiments, the top capping layer 113 may be formed of, for example, silicon nitride. In some embodiments, the top capping layer 113 may be formed of the same material as the bottom capping layer 111. In some embodiments, the top capping layer 113 may be formed by, for example, chemical vapor deposition, plasma-enhanced chemical vapor deposition, or other applicable deposition processes. A planarization process, such as chemical mechanical polishing, may be performed to remove excess material and provide a substantially flat surface for subsequent processing steps.

Figure 17:
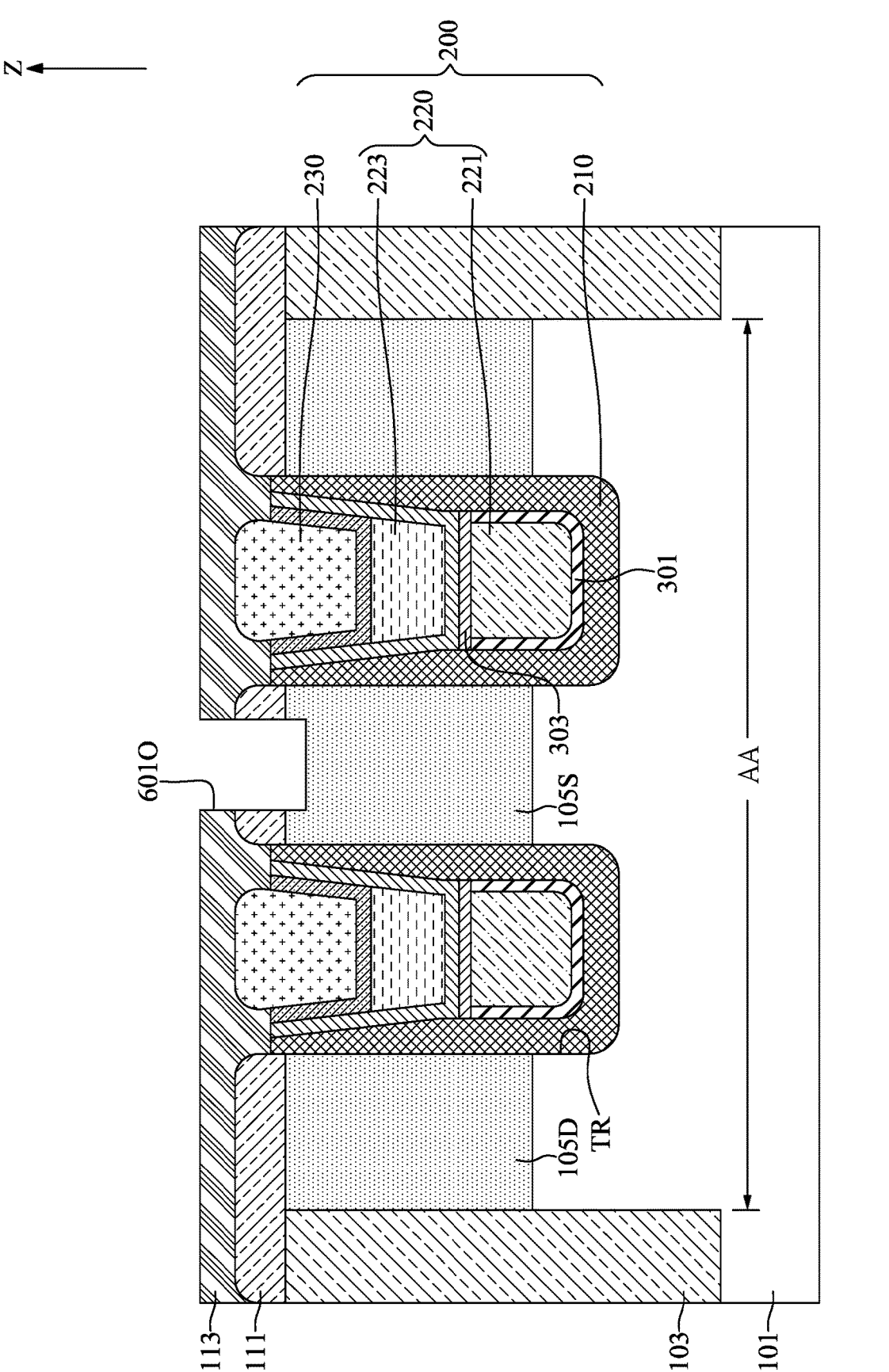

With reference to FIG. 17, a bit-line-contact opening 601O may be formed through the top capping layer 113 and the bottom capping layer 111 and extending to the source region 105S. A cleaning process may be performed after the formation of the bit-line-contact opening 601O to remove residues remaining in the bit-line-contact opening 601O. Without the presence of the top capping layer 113, the cleaning process might erode the word line dielectric layer 210, the bottom thickening layer 401, and the top thickening layer 403. This erosion risks exposing the source region 105S and/or the drain region 105D. Consequently, when a conductive material is filled in to form a bit line contact, a short circuit may occur. In contrast, the presence of the top capping layer 113 safeguards the word line dielectric layer 210, the bottom thickening layer 401, and the top thickening layer 403 during the cleaning process, thereby preventing short circuits.

Figure 18:
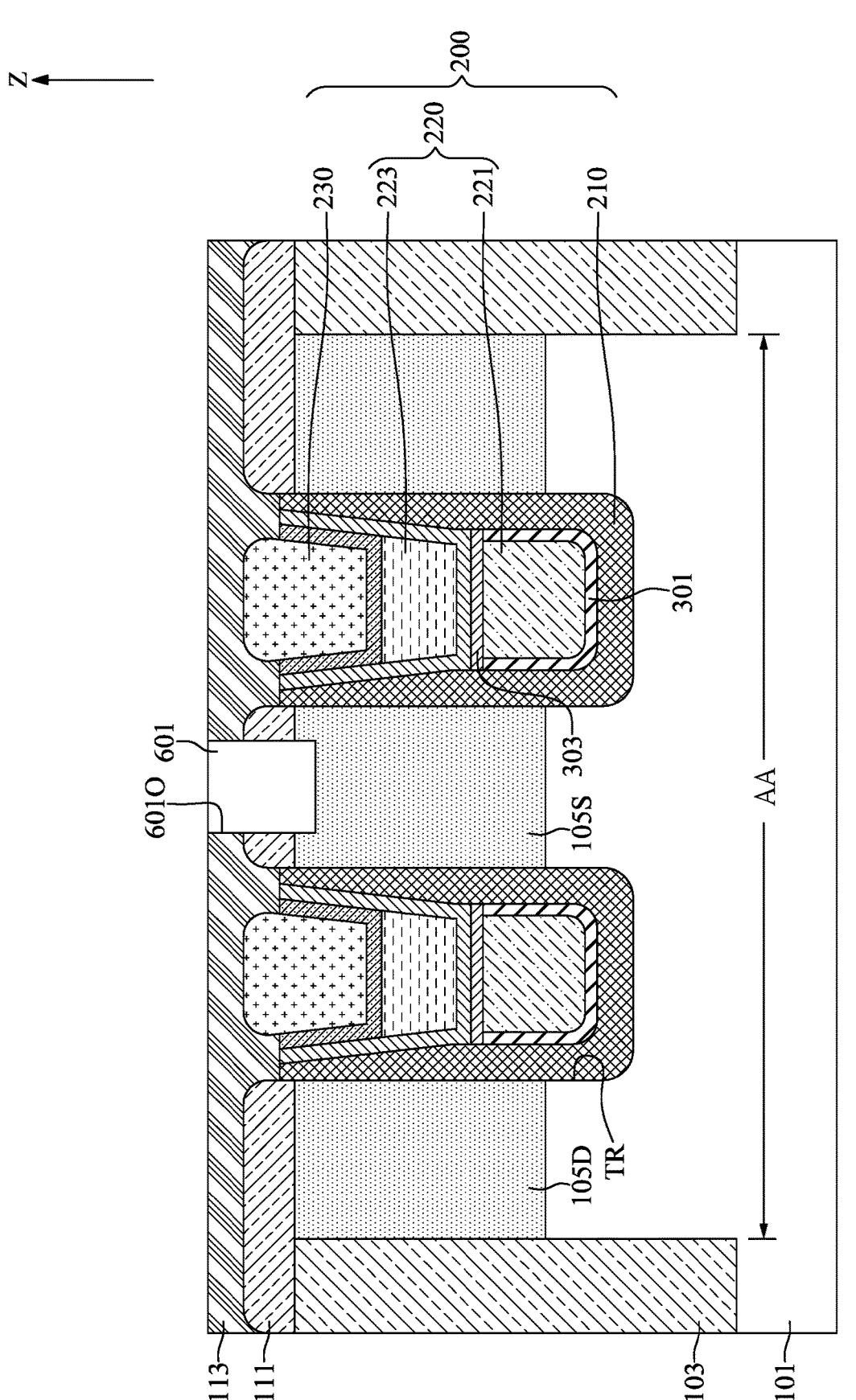

With reference to FIG. 18, a bit line contact 601 may be formed in the bit-line-contact opening 601O and electrically connect to the source region 105S. In some embodiments, the bit line contact 601 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

Figure 19:
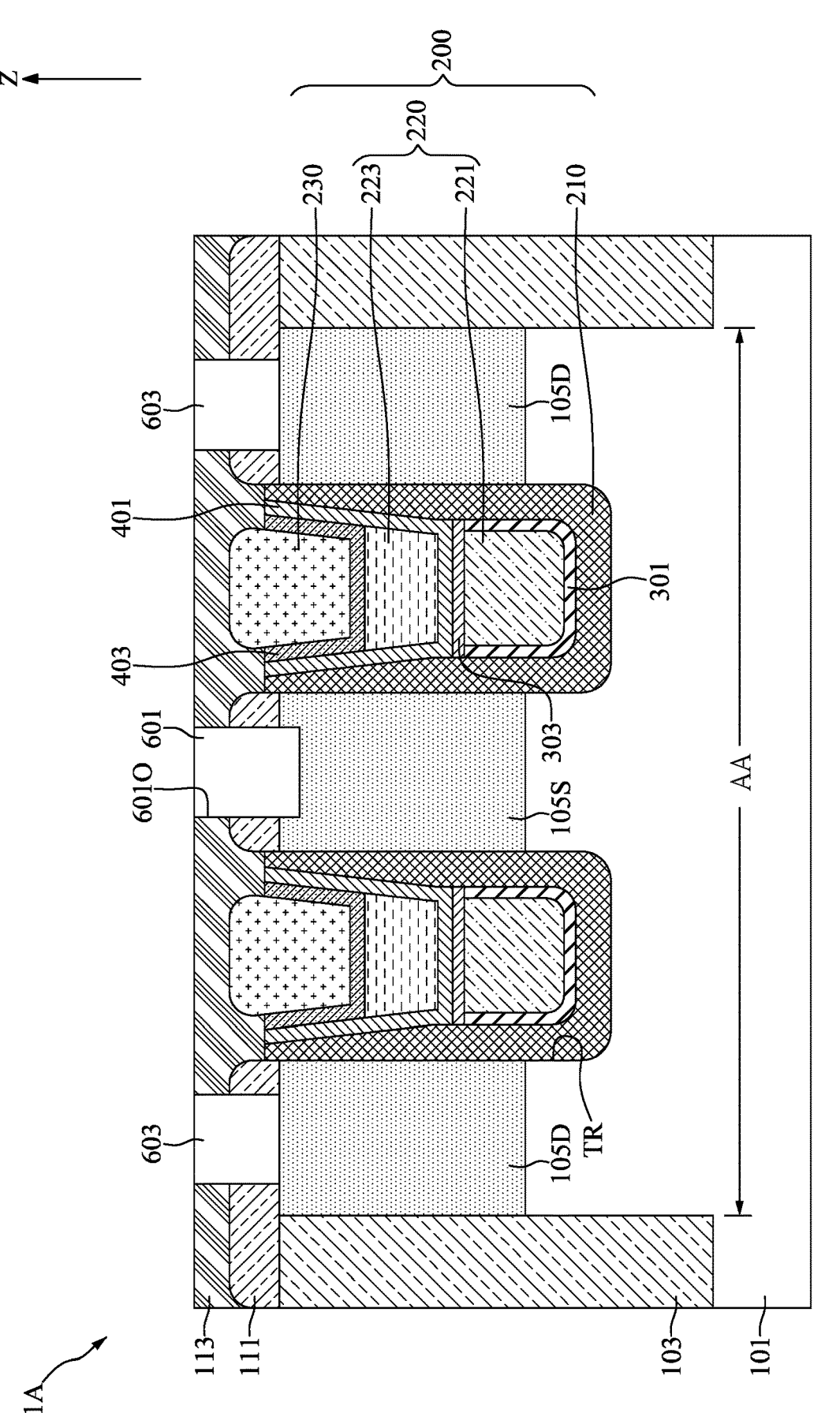

With reference to FIG. 19, the plurality of cell contacts 603 may be formed through the top capping layer 113 and the bottom capping layer 111. The plurality of cell contacts 603 may be formed on the plurality of drain regions 105D, respectively and correspondingly. In some embodiments, the plurality of cell contacts 603 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of cell contacts 603 may electrically connect the plurality of drain regions 105D, respectively and correspondingly.

Figure 20:
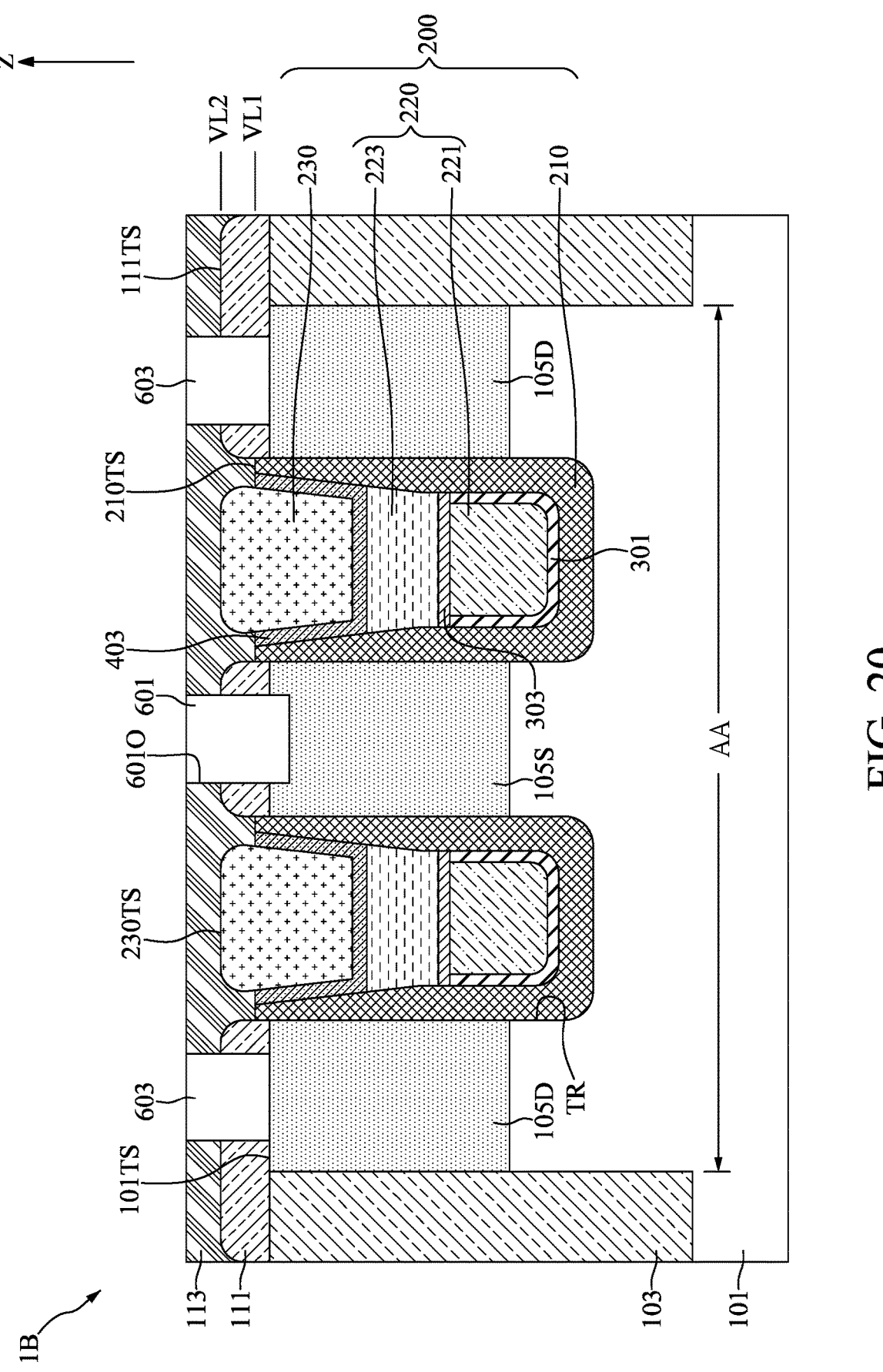
FIGS. 20 to 22 illustrate, in schematic cross-sectional view diagrams, semiconductor devices in accordance with some embodiments of the present disclosure.
Figure 21:
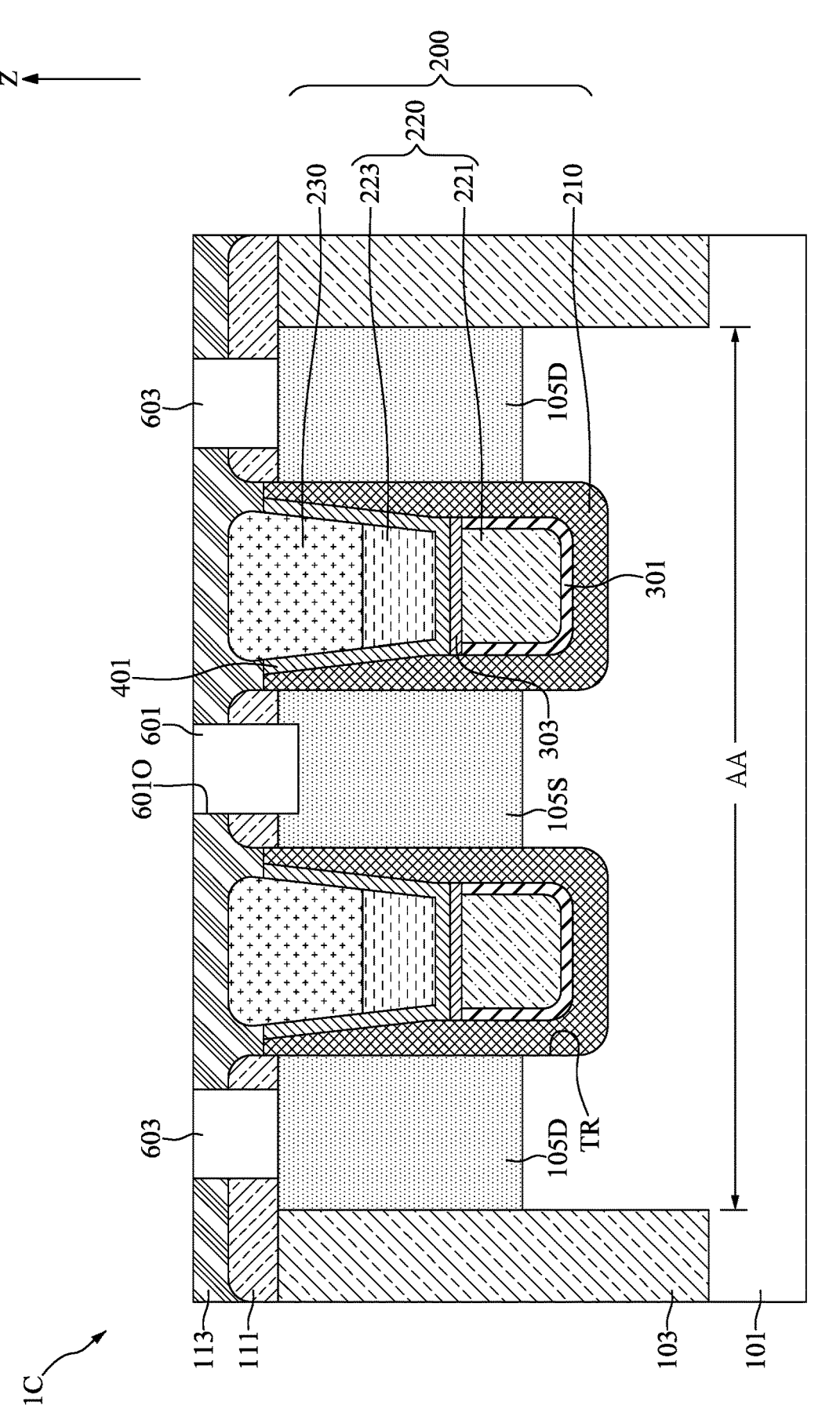
Figure 22:
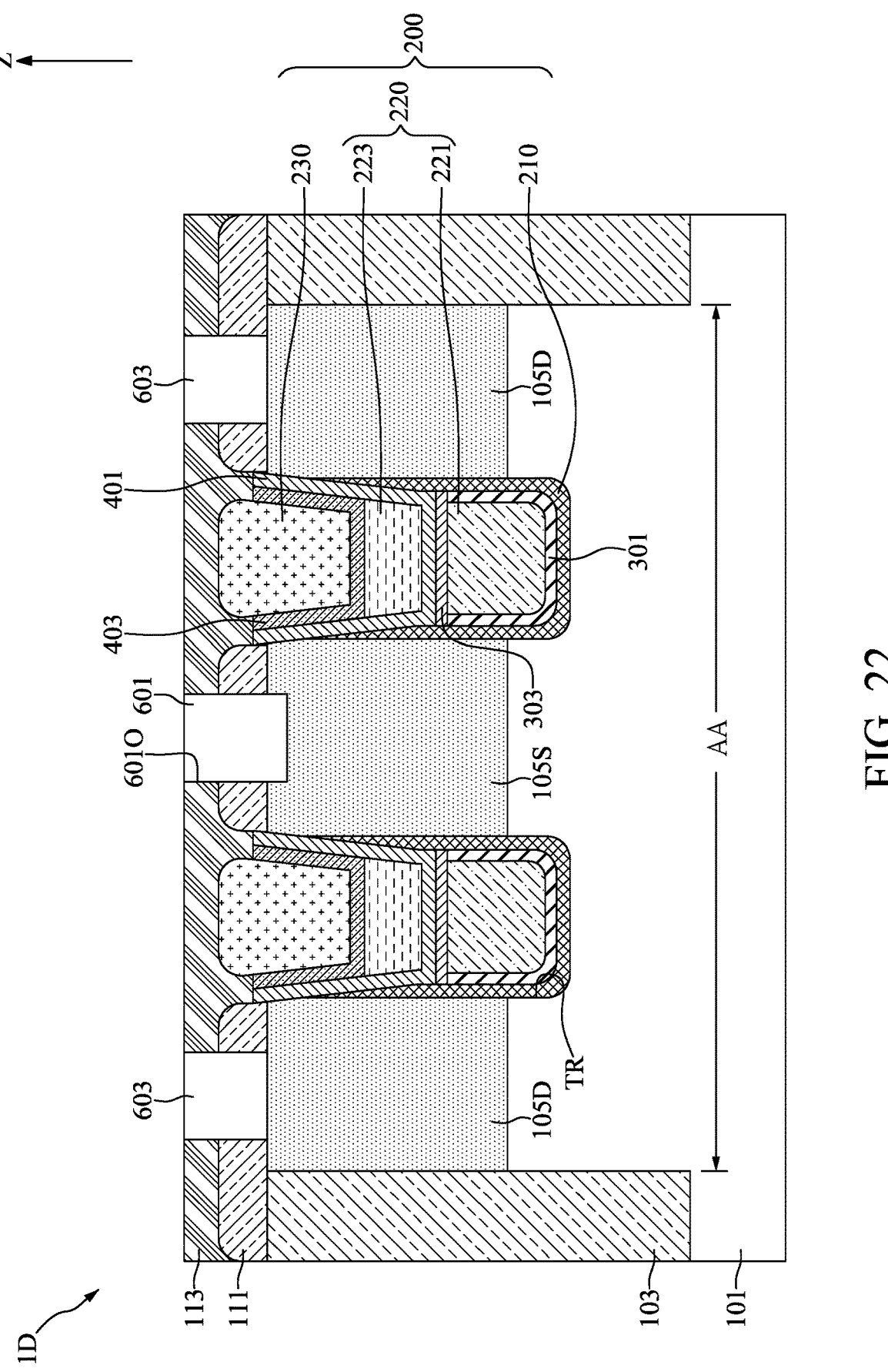

FIGS. 20 to 22 illustrate, in schematic cross-sectional view diagrams, semiconductor devices 1B, 1C, and 1D in accordance with some embodiments of the present disclosure.

With reference to FIG. 20, the semiconductor device 1B may have a structure similar to that illustrated in FIG. 19. The same or similar elements in FIG. 20 as in FIG. 19 have been marked with similar reference numbers and duplicative descriptions have been omitted.

With reference to FIG. 20, only the top thickening layer 403 is present. The top conductive portion 223 may be disposed on the middle barrier layer 303. The word line capping layer 230 may be disposed on the top conductive portion 223. The top thickening layer 403 may be disposed between the top conductive portion 223 and the word line capping layer 230 and between the word line dielectric layer 210 and the word line capping layer 230.

With reference to FIG. 21, the semiconductor device 1C may have a structure similar to that illustrated in FIG. 19. The same or similar elements in FIG. 21 as in FIG. 19 have been marked with similar reference numbers and duplicative descriptions have been omitted.

With reference to FIG. 21, only the bottom thickening layer 401 is present. The word line capping layer 230 may be disposed on the top conductive portion 223. The bottom thickening layer 401 may be disposed between the middle barrier layer 303 and the top conductive portion 223, between the top conductive portion 223 and the word line dielectric layer 210, and between the word line capping layer 230 and the word line dielectric layer 210.

With reference to FIG. 22, the semiconductor device 1D may have a structure similar to that illustrated in FIG. 19. The same or similar elements in FIG. 22 as in FIG. 19 have been marked with similar reference numbers and duplicative descriptions have been omitted.

In the semiconductor device 1D, the upper section of the word line dielectric layer 210 may be totally consumed before forming the bottom thickening layer 401 and the top thickening layer 403 (e.g., during the etching back illustrated in FIG. 6) so that the source region 105S and the drain region 105D may be exposed during the formation of the bottom thickening layer 401. Therefore, the bottom thickening layer 401 may be disposed between the middle barrier layer 303 and the top conductive portion 223, between the (lower section of the) word line dielectric layer 210, and between the top thickening layer 403 and the source region 105S (and the drain region 105D).

One aspect of the present disclosure provides a semiconductor device including a substrate; a word line structure including a word line dielectric layer positioned in the substrate and including a U-shaped cross-sectional profile, a word line conductive layer positioned on the word line dielectric layer and within the substrate, and a word line capping layer positioned on the word line conductive layer; a top thickening layer including a U-shaped cross-sectional profile, positioned between the word line conductive layer and the word line capping layer, and between the word line dielectric layer and the word line capping layer; a bottom capping layer positioned on the substrate and adjacent to the word line dielectric layer; and a top capping layer covering the bottom capping layer and the word line structure. A top surface of the top thickening layer and a top surface of the word line dielectric layer are substantially coplanar and are at a vertical level higher than a top surface of the substrate.

One aspect of the present disclosure provides a semiconductor device including a substrate; a word line structure including a word line dielectric layer positioned in the substrate and including a U-shaped cross-sectional profile, a word line conductive layer including a bottom conductive portion positioned on the word line dielectric layer and within the substrate, and a top conductive portion positioned on the bottom conductive portion and within the substrate, and a word line capping layer positioned on the word line conductive layer; a bottom thickening layer including a U-shaped cross-sectional profile, positioned between the bottom conductive portion and the top conductive portion, between the top conductive portion and the word line dielectric layer, and between the word line capping layer and the word line dielectric layer; a bottom capping layer positioned on the substrate and adjacent to the word line dielectric layer; and a top capping layer covering the bottom capping layer and the word line structure. A top surface of the bottom thickening layer and a top surface of the word line dielectric layer are substantially coplanar and are at a vertical level higher than a top surface of the substrate.

Another aspect of the present disclosure provides a method for fabricating a semiconductor device including providing a substrate, forming a bottom capping layer on the substrate, and forming a word line trench through the substrate and extending to the substrate; conformally forming a word line dielectric layer on the word line trench; forming a bottom conductive portion on the word line dielectric layer and within the word line trench; conformally forming a layer of first thickening material on the bottom conductive portion, the word line dielectric layer, and the bottom capping layer; forming a top conductive portion on the layer of first thickening material and within the word line trench; conformally forming a layer of second thickening material on the top conductive portion and the layer of first thickening material; forming a layer of top insulating material on the layer of second thickening material, completely filling the word line trench; removing portions of the second thickening material, the first thickening material, and the top insulating material to respectively form a top thickening layer, a bottom thickening layer, and a word line capping layer while concurrently recessing the word line dielectric layer; and forming a top capping layer covering the bottom capping layer, the word line dielectric layer, the word line capping layer, the bottom thickening layer, and the top thickening layer.

Due to the design of the semiconductor device of the present disclosure, the gate-induced drain leakage issue is effectively mitigated by enhancing the thickness of the word line dielectric layer 210 through the addition of the bottom thickening layer 401 and/or the top thickening layer 403, thereby improving the performance of semiconductor device 1A. Additionally, the top capping layer 113 shields the word line dielectric layer 210, bottom thickening layer 401, and top thickening layer 403 during etching and/or cleaning processes. This protection prevents these layers from being recessed and potentially exposing the drain region 105D and source region 105S, thereby averting short circuits that could occur due to such exposure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A semiconductor device, comprising:
a substrate;
a word line structure comprising:
a word line dielectric layer positioned in the substrate and comprising a U-shaped cross-sectional profile;
a word line conductive layer positioned on the word line dielectric layer and within the substrate; and
a word line capping layer positioned on the word line conductive layer;
a top thickening layer comprising a U-shaped cross-sectional profile, positioned between the word line conductive layer and the word line capping layer, and between the word line dielectric layer and the word line capping layer;
a bottom capping layer positioned on the substrate and adjacent to the word line dielectric layer; and
a top capping layer covering the bottom capping layer and the word line structure;
wherein a top surface of the top thickening layer and a top surface of the word line dielectric layer are substantially coplanar and are at a vertical level higher than a top surface of the substrate.
2. The semiconductor device of claim 1, wherein a top surface of the word line capping layer is at a vertical level higher than the vertical level of the top surface of the top thickening layer.
3. The semiconductor device of claim 2, wherein the top surface of the word line capping layer is curved.
4. The semiconductor device of claim 1, wherein a top surface of the bottom capping layer is at a vertical level higher than the vertical level of the top surface of the top thickening layer.
5. The semiconductor device of claim 4, wherein the top surface of the bottom capping layer and a top surface of the word line capping layer are substantially coplanar.
6. The semiconductor device of claim 4, wherein the top surface of the bottom capping layer is curved.
7. The semiconductor device of claim 1, further comprising a bottom barrier layer positioned between the word line conductive layer and the word line dielectric layer.
8. The semiconductor device of claim 1, wherein the word line conductive layer comprises:

a bottom conductive portion positioned on the word line dielectric layer and within the substrate; and a top conductive portion positioned on the bottom conductive portion and within the substrate;

wherein the top thickening layer is positioned between the top conductive portion and the word line capping layer.

9. The semiconductor device of claim 8, further comprising a middle barrier layer positioned between the bottom conductive portion and the top conductive portion.

10. The semiconductor device of claim 8, wherein the bottom conductive portion comprises tungsten, cobalt, zirconium, tantalum, aluminum, ruthenium, copper, metal carbides, transition metal aluminides, or a combination thereof.

11. The semiconductor device of claim 8, wherein the top conductive portion comprises polycrystalline silicon, polycrystalline germanium, polycrystalline silicon germanium, doped polycrystalline silicon, doped polycrystalline germanium, doped polycrystalline silicon germanium, or a combination thereof.

12. The semiconductor device of claim 9, wherein the middle barrier layer comprises titanium nitride, titanium, or a combination thereof.

13. A semiconductor device, comprising:

a substrate;

a word line structure comprising:

a word line dielectric layer positioned in the substrate and comprising a U-shaped cross-sectional profile;

a word line conductive layer comprising a bottom conductive portion positioned on the word line dielectric layer and within the substrate, and a top conductive portion positioned on the bottom conductive portion and within the substrate; and a word line capping layer positioned on the word line conductive layer;

a bottom thickening layer comprising a U-shaped cross-sectional profile, positioned between the bottom conductive portion and the top conductive portion, between the top conductive portion and the word line dielectric layer, and between the word line capping layer and the word line dielectric layer;

a bottom capping layer positioned on the substrate and adjacent to the word line dielectric layer; and a top capping layer covering the bottom capping layer and the word line structure;

wherein a top surface of the bottom thickening layer and a top surface of the word line dielectric layer are substantially coplanar and are at a vertical level higher than a top surface of the substrate.

14. The semiconductor device of claim 13, further comprising a top thickening layer, wherein the top thickening layer comprises a U-shaped cross-sectional profile and is positioned between the top conductive portion and the word line capping layer, and between the word line capping layer and the bottom thickening layer.

15. The semiconductor device of claim 14, wherein a top surface of the top thickening layer and the top surface of the bottom thickening layer are substantially coplanar.

16. The semiconductor device of claim 14, wherein a top surface of the word line capping layer is at a vertical level higher than the vertical level of the top surface of the bottom thickening layer.

17. The semiconductor device of claim 16, wherein the top surface of the word line capping layer is curved.

18. The semiconductor device of claim 14, wherein a top surface of the bottom capping layer is at a vertical level higher than the vertical level of the top surface of the bottom thickening layer.

19. The semiconductor device of claim 14, wherein the top surface of the bottom capping layer is curved.

20. The semiconductor device of claim 14, further comprising a bottom barrier layer positioned between the bottom conductive portion and the word line dielectric layer.

* * * * *